US00RE46202E

(19) United States
(12) Reissued Patent
Okahiro et al.

(10) Patent Number: US RE46,202 E
(45) Date of Reissued Patent: Nov. 8, 2016

(54) SEMICONDUCTOR MEMORY DEVICE OF OPEN BIT LINE TYPE

(71) Applicant: PS4 LUXCO S.A.R.L., Luxembourg (LU)

(72) Inventors: Tetsuaki Okahiro, Tokyo (JP); Hiromasa Noda, Tokyo (JP)

(73) Assignee: Longitude Semiconductor S.a.r.l., Luxembourg (LU)

(21) Appl. No.: 13/968,963

(22) Filed: Aug. 16, 2013

Related U.S. Patent Documents

Reissue of:
(64) Patent No.: 8,000,123
Issued: Aug. 16, 2011
Appl. No.: 12/537,639
Filed: Aug. 7, 2009

(30) Foreign Application Priority Data

Aug. 7, 2008 (JP) ..... 2008-203747

(51) Int. Cl.
*G11C 5/06* (2006.01)
*G11C 11/22* (2006.01)

(52) U.S. Cl.
CPC ..... *G11C 11/22* (2013.01); *G11C 5/063* (2013.01)

(58) Field of Classification Search
CPC ..... G11C 5/06; G11C 11/24; G11C 7/00; G11C 11/22; G11C 11/2273; G11C 5/063; G11C 7/14
USPC ..... 365/63, 145, 149
See application file for complete search history.

(56) References Cited

U.S. PATENT DOCUMENTS

| | | | | |
|---|---|---|---|---|
| 5,383,159 | A | 1/1995 | Kubota | |
| 6,160,753 | A * | 12/2000 | Shibayama | 365/230.03 |
| 6,867,994 | B2 * | 3/2005 | Tsukikawa | 365/72 |
| 7,023,752 | B2 * | 4/2006 | Ohsawa | 365/205 |
| 7,051,260 | B2 * | 5/2006 | Ito et al. | 714/754 |
| 7,072,204 | B2 * | 7/2006 | Tsukikawa et al. | 365/149 |
| 7,184,290 | B1 * | 2/2007 | Lee et al. | 365/63 |

FOREIGN PATENT DOCUMENTS

| | | | |
|---|---|---|---|
| JP | 64-013290 | A | 1/1989 |
| JP | 06-103754 | A | 4/1994 |
| JP | 07-015791 | A | 1/1995 |
| JP | 09-135004 | A | 5/1997 |
| JP | 11-251548 | A | 9/1999 |
| JP | 2003-324160 | A | 11/2003 |

* cited by examiner

*Primary Examiner* — Tuan H Nguyen

(57) ABSTRACT

There is provided a semiconductor memory device that includes: a plurality of memory mats each including a plurality of word lines, a plurality of bit lines, a plurality of memory cells each located at an intersection between the word line and the bit line, and at least one dummy word line not having connection to a dummy cell; a plurality of sense amplifier arrays located between adjacent memory mats, the sense amplifier arrays including a plurality of sense amplifiers including a pair of input/output nodes, one of which pair is connected to the bit lines of the adjacent memory mats on one side and the other of which pair is connected to the bit lines of the adjacent memory mats on the other side, respectively; and an activating unit which, in response to activation of the word line in a memory mat selected from the memory mats, activates the dummy word line in the memory mat adjacent to the selected memory mat.

22 Claims, 9 Drawing Sheets

| | | | | | | | | |
|---|---|---|---|---|---|---|---|---|
| M2 | 0 | 0 | 0 | 0 | 1 | 1 | 1 | 1 |
| M1 | 0 | 0 | 1 | 1 | 0 | 0 | 1 | 1 |
| M0 | 0 | 1 | 0 | 1 | 0 | 1 | 0 | 1 |
| SELECT | 0 | 1 | 2 | 3 | 4 | 5 | 6 | 7 |
| DUMMY | 1,7 | 0,2 | 1,3 | 2,4 | 3,5 | 4,6 | 5,7 | 6,8 |

FIG.9

SEMICONDUCTOR MEMORY DEVICE OF OPEN BIT LINE TYPE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND OF THE INVENTION

1. Field of the Invention

The present invention relates to a semiconductor memory device, and particularly to a semiconductor memory device of an open bit line type.

2. Description of Related Art

A semiconductor memory device represented by a DRAM includes a sense amplifier connected to a pair of bit lines, and a potential difference appearing in the bit line pair is amplified by the sense amplifier. Known methods for wiring a bit line pair include a folded bit line type in which a bit line pair is wired in the same direction as viewed from a sense amplifier, and an open bit line type in which a bit line pair is wired in the opposite direction to each other as viewed from a sense amplifier.

In the folded bit line type, the pair of bit lines intersects the same word line, and thus when a word line is activated, the same coupling noise is superposed on the bit lines. Thus, the noise accompanying with the activation of the word line is cancelled. On the other hand, in the open bit line type, the pair of bit lines intersects mutually different word lines, and thus when the word line is activated, coupling noise is superposed on only one of the bit lines. Thus, an operation margin of the sense amplifier is reduced, and data can be inverted in some cases.

As a method of solving the problem in the open bit line type, there is known a method of canceling noise by using a dummy word line (see Japanese Patent Application Laid-open No. H6-103754: hereinafter referred to as "patent document 1").

However, in the semiconductor memory device described in the above patent document 1, a dummy cell is connected to a dummy word line. Accordingly, a memory cell, which is a reading target, is connected to one of bit lines and the dummy cell is connected to the other of the bit lines. Therefore, to prevent a problem in a sense operation, it is necessary to correctly control a potential to be stored in the dummy cell. Generally, one dummy cell is shared by a large number of memory cells. Therefore, to equalize the influence exerted on memory cells in which a high level is stored and on memory cells in which a low level is stored, it is necessary to accurately set the potential to be stored in the dummy cell to an intermediate level (an intermediate potential between high level and low level). This configuration requires a circuit that produces an accurate intermediate level, and as a result, there arises a problem that the chip size is increased.

Furthermore, according to the technique of the above patent document 1, it is necessary to have, within a memory mat, an active region in which a dummy cell is formed, and this can cause a problem of increasing the chip size.

SUMMARY

The present invention seeks to solve one or more of the above problems, or to improve upon those problems at least in part.

In one embodiment, there is provided a semiconductor memory device that includes: a plurality of memory mats each including a plurality of word lines, a plurality of bit lines, a plurality of memory cells each located at an intersection between the word line and the bit line, and at least one dummy word line not having connection to a dummy cell; a plurality of sense amplifier arrays located between adjacent memory mats, the sense amplifier arrays including a plurality of sense amplifiers including a pair of input/output nodes, one of which pair is connected to the bit lines of the adjacent memory mats on one side and the other of which pair is connected to the bit lines of the adjacent memory mats on the other side, respectively; and an activating unit which, in response to activation of the word line in a memory mat selected from the memory mats, activates the dummy word line in the memory mat adjacent to the selected memory mat.

According to the semiconductor memory device of the present invention, it is unnecessary to store an intermediate potential or the like in a dummy cell, and this eliminates necessity of arranging a circuit that produces such a potential. Further, the dummy cell itself is not required, and this eliminates even necessity of having, within a memory mat, an active region in which the dummy cell is formed. Thus, according to the present invention, it is possible to cancel coupling noise occurring in an open bit line type while suppressing the problem of increasing the chip size.

BRIEF DESCRIPTION OF THE DRAWINGS

The above features and advantages of the present invention will be more apparent from the following description of certain preferred embodiments taken in conjunction with the accompanying drawings, in which:

FIG. 9 is a table showing relations among values of mat selection signals, activated selection signals, and dummy selection signals; FIG. 10A shows a case that a high level is held at the cell capacitor C of the memory cell MC, which is a reading target, and FIG. 10B shows a case that a low level is held at the same.

DETAILED DESCRIPTION OF THE EMBODIMENTS

Preferred embodiments of the present invention will be explained below in detail with reference to the accompanying drawings.

Figure 1:
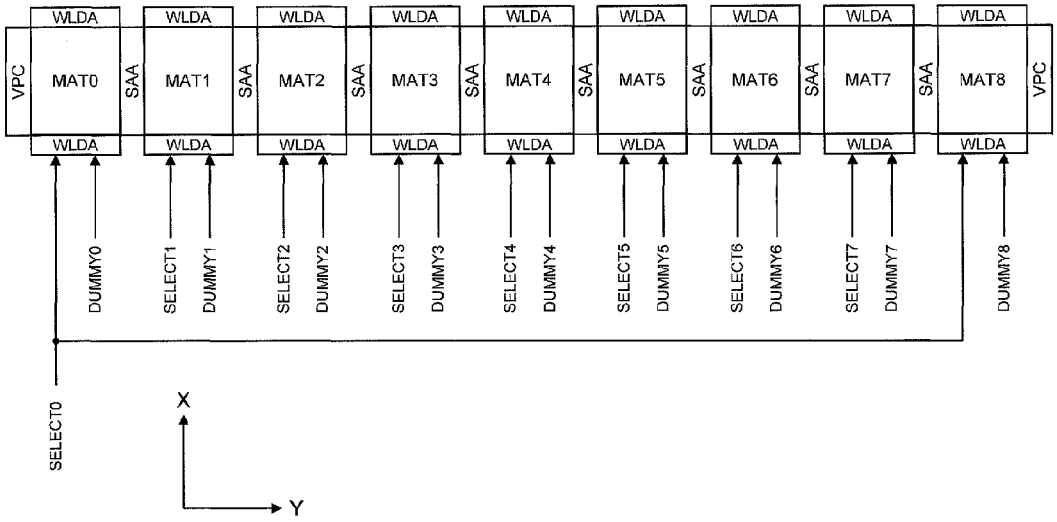
FIG. 1 is a layout diagram of a configuration of a memory cell array unit of a semiconductor memory device according to a preferred embodiment of the present invention.

FIG. 1 is a layout diagram of a configuration of a memory cell array unit of a semiconductor memory device according to a preferred embodiment of the present invention.

As shown in FIG. 1, the memory cell array unit of the semiconductor memory device includes nine memory mats MAT0 to MAT8 aligned in a Y direction. Sense amplifier arrays SAA are each located between the adjacent memory mats. On both sides of an X direction of each of the memory mats MAT0 to MAT8, word line driver arrays WLDA are located. While the nine memory mats MAT0 to MAT8 are aligned in one array in the present embodiment, the number of memory mats aligned in one array is not particularly limited in the present invention.

The memory mats MAT0 to MAT8 are selected by respectively corresponding selection signals SELECT0 to SELECT7. However, the memory mats MAT0 and MAT8 positioned at both ends are selected by the same selection signal SELECT0. The reason for this is that the number of bit lines BL included in the memory mats MAT0 and MAT8 positioned at the both ends is half the number of the bit lines BL included in the other memory mats MAT1 to MAT7, and thus a combination of the two memory mats MAT0 and MAT8 becomes equal to one of the memory mats MAT1 to MAT7.

Further, to each of the memory mats MAT0 to MAT8, dummy selection signals DUMMY0 to DUMMY8 are allocated. The dummy selection signals DUMMY0 to DUMMY8 activate dummy word lines DWL (described later). As shown in FIG. 1, also to the memory mats MAT0 and MAT8 positioned at both ends, individual dummy selection signals DUMMY0 and DUMMY8 are allocated.

Figure 2:
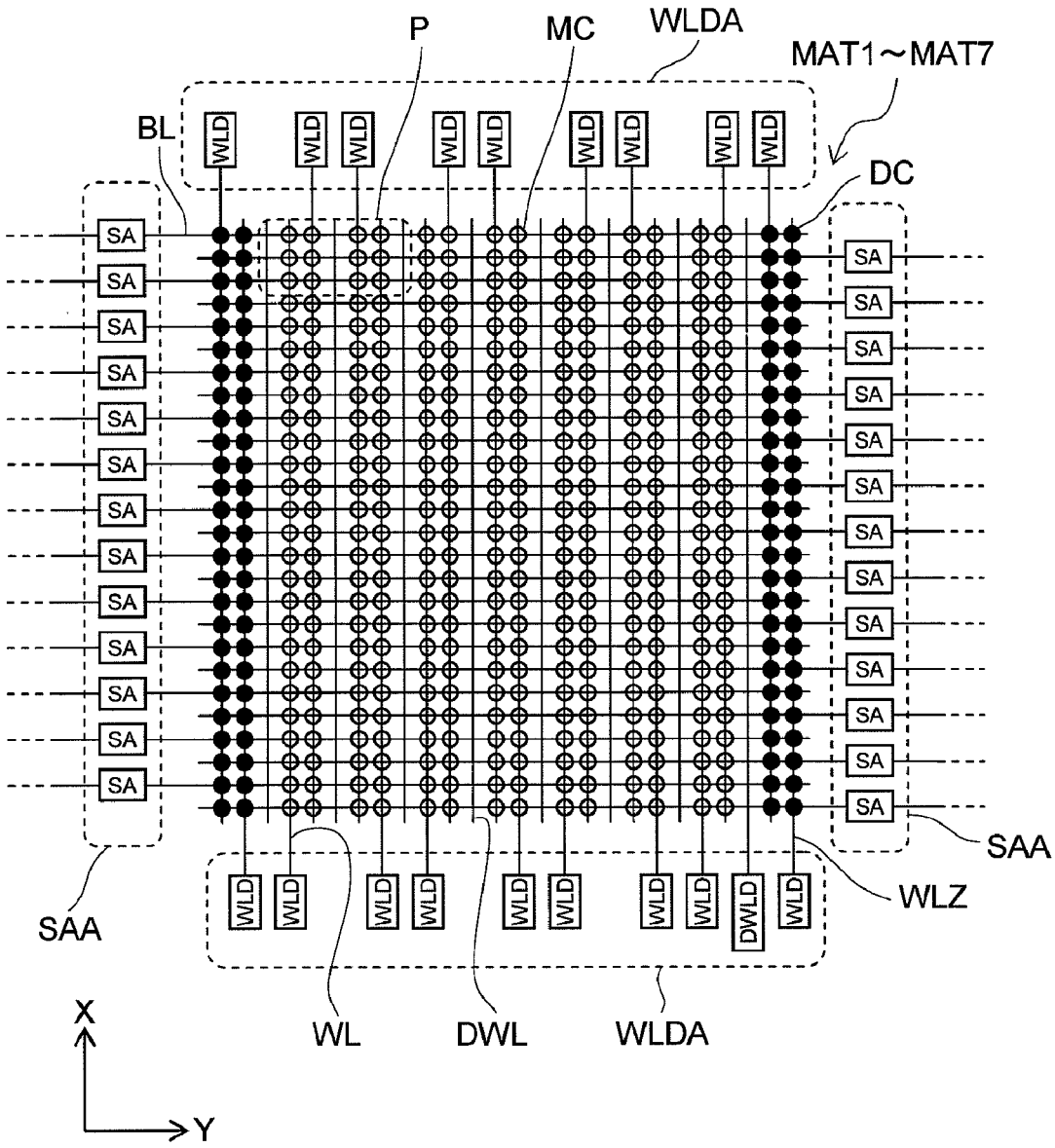
FIG. 2 is a diagram showing a circuit configuration of the memory mats MAT1 to MAT7 except for the memory mats MAT0 and MAT8 positioned at both ends.
Figure 3:
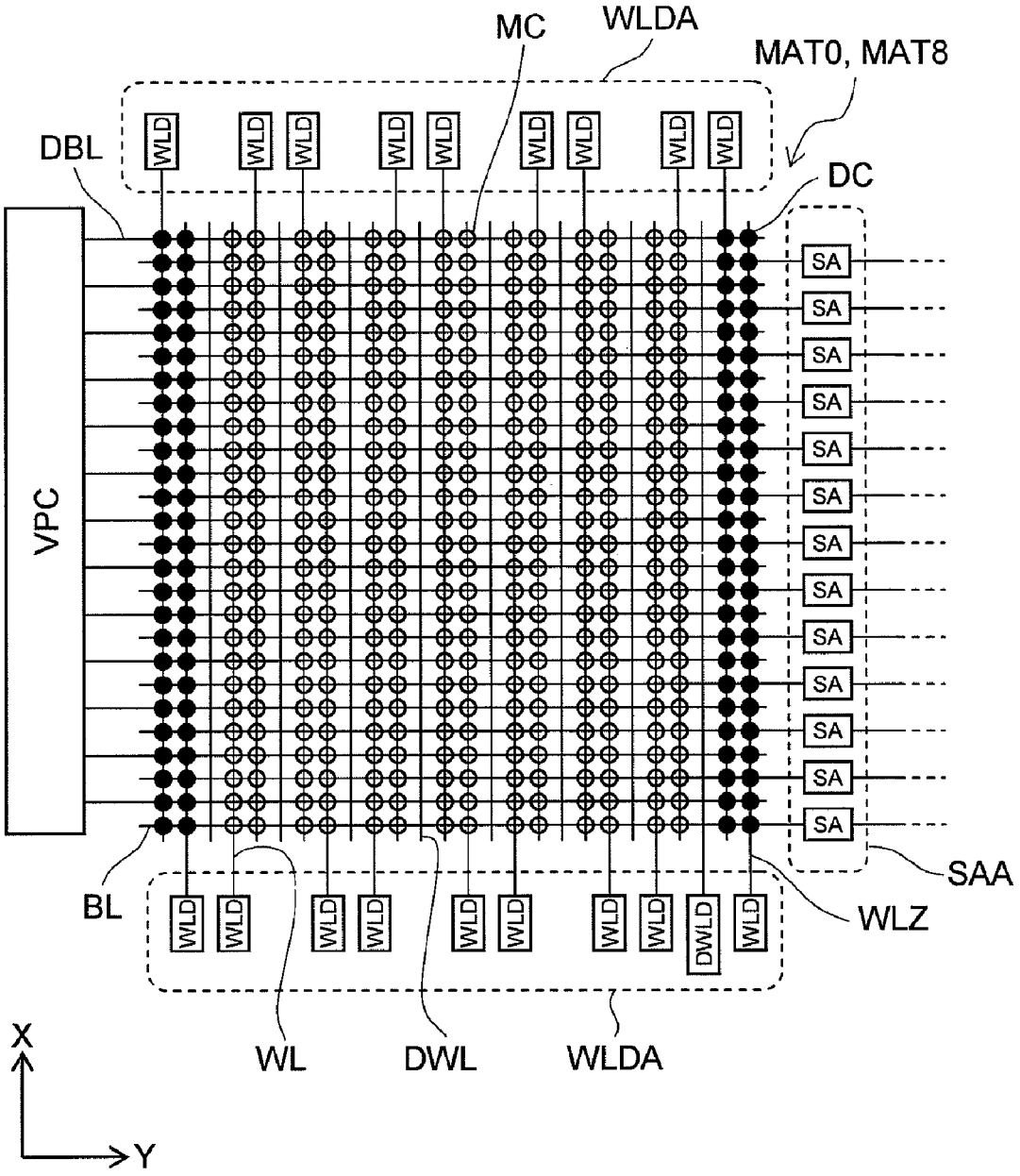
FIG. 3 is a diagram showing a circuit configuration of the memory mats MAT0 and MAT8 positioned at the both ends.

FIG. 2 shows a circuit configuration of the memory mats MAT1 to MAT7 except for the memory mats MAT0 and MAT8 positioned at both ends. FIG. 3 shows a circuit configuration of the memory mats MAT0 and MAT8 positioned at the both ends.

As shown in FIG. 2 and FIG. 3, each of the memory mats MAT0 to MAT8 includes a plurality of word lines WL wired in the X direction, a plurality of the bit lines BL wired in the Y direction, and memory cells MC located at an intersection between each word line WL and bit line BL. The number of the word lines WL and the bit lines BL shown in FIG. 2 and FIG. 3 is only exemplary, and the present invention is not limited thereto.

Half a plurality of word lines WL are connected to the word line driver array WLDA located on one side in the X direction, and the other half thereof are connected to the word line driver array WLDA located on the other side in the X direction. The word line driver array WLDA is constituted by a plurality of word line drivers WLD that drive the respectively corresponding word lines WL.

However, within each memory mat, several word lines WL (in this embodiment, two word lines WL each positioned at both ends within each memory mat) positioned at the ends of the Y direction are not used, and these are unused word lines WLZ. This can be explained by the fact that a defective cell tends to be generated at the end of each memory mat because the process condition during manufacturing slightly differs between the end of the memory mat and the center thereof. Accordingly, the memory cells MC connected to the unused word lines WLZ are treated as dummy cells DC. Each unused word line WLZ is fixed in an inactive state, and thus the dummy cell DC is not connected to the bit line BL.

Further, in the memory mats MAT0 to MAT8, the dummy word lines DWL located at intervals of every two word lines WL wired in the X direction are further arranged. That is, the two word lines WL and one dummy word line DWL are combined to serve as a unit configuration, and the unit configurations are repeatedly located in the Y direction. As shown in FIGS. 2 and 3, one dummy word line DWL is connected to a dummy word line driver DWLD included in the word line driver array WLDA. The dummy word line driver DWLD is a circuit that activates the dummy word lines DWL in response to the corresponding dummy selection signals DUMMY0 to DUMMY8. Which dummy word line DWL, among the dummy word lines DWL, is connected to the dummy word line driver DWLD is not particularly limited. The other dummy word lines DWL not connected to the dummy word line driver DWLD are fixed to a ground potential.

At each intersection between the dummy word line DWL and the bit line BL, the memory cell MC or the dummy cell DC is not located. That is, the dummy word line DWL realizes uniform pitches (line and space) in the Y direction by including therein the word lines WL and the dummy word lines DWL to make uniform the dimension or the like of a pattern of the two adjacent word lines WL during manufacturing. Moreover, in accessing the memory cell MC (for example, a cell contact 12: described later) adjacent to that dummy word line DWL, the dummy word line DWL suppresses a so-called electrical disturbance between that memory cell MC and a different memory cell MC opposite via an element isolation region 20, thereby improving the reliability. Suppression of the disturbance can be realized by setting the dummy word line DWL to the same potential (negative potential or VSS) as that of an inactive word line WL when the memory cell MC within the memory mat in which the dummy word line DWL is located is accessed. As a result, in the layout of the memory cell MC of $6F^2$ (described later), the dummy word line DWL is imparted with a viewpoint of manufacturing, as well as the reliability. Meanwhile, from a viewpoint that the actual memory cell MC (to which an address of an address space on the system is allocated) is not connected and storage information itself is not accessed, the use of a dummy wire that is not basically attributed to an operation sequence in a real memory cell access can suffice. In other words, functional control of the dummy word line DWL is not particularly needed. The present inventor modifies this viewpoint, invented the functional control of the dummy word line DWL under a predetermined condition, and disclosed the idea. Rather than utilizing the unused word line WLZ as the dummy word line DWL, the dummy word line DWL (produced in the layout of the memory cell MC of $6F^2$ described later) present between a plurality of word lines WL corresponding to regular memory cells MC is utilized. The reason why a region in which the dummy word line DWL is located is arranged is that a layout in which the area occupied by the memory cell MC is $6F^2$, where F denotes the minimum processing dimension, is adopted.

Further, the present invention provides an effect obtained when the dummy word lines DWL located between a predetermined number of continued regular word lines WL are used in a functional manner disclosed in the present invention, which is more advantageous than the effect obtained when the unused word lines WLZ located at both ends within the memory mat and the dummy cell DC are assumed to be presumably used as the dummy word line DWL. That is, as described above, the ends within the mat, after manufacturing, is a dimensional value of a pattern different from that of the regular word line WL. The word lines WL and the dummy word lines DWL intersect with the respectively corresponding bit lines BL. Areas at the respective intersections are primary coupling values as a condenser. This can be explained by the fact that when an amount of coupling that the regular word line WL applies to the bit line BL and an amount of coupling that the dummy word line DWL applies to the bit line BL differ, the sensibility of a sense amplifier SA is lowered.

Figure 4:
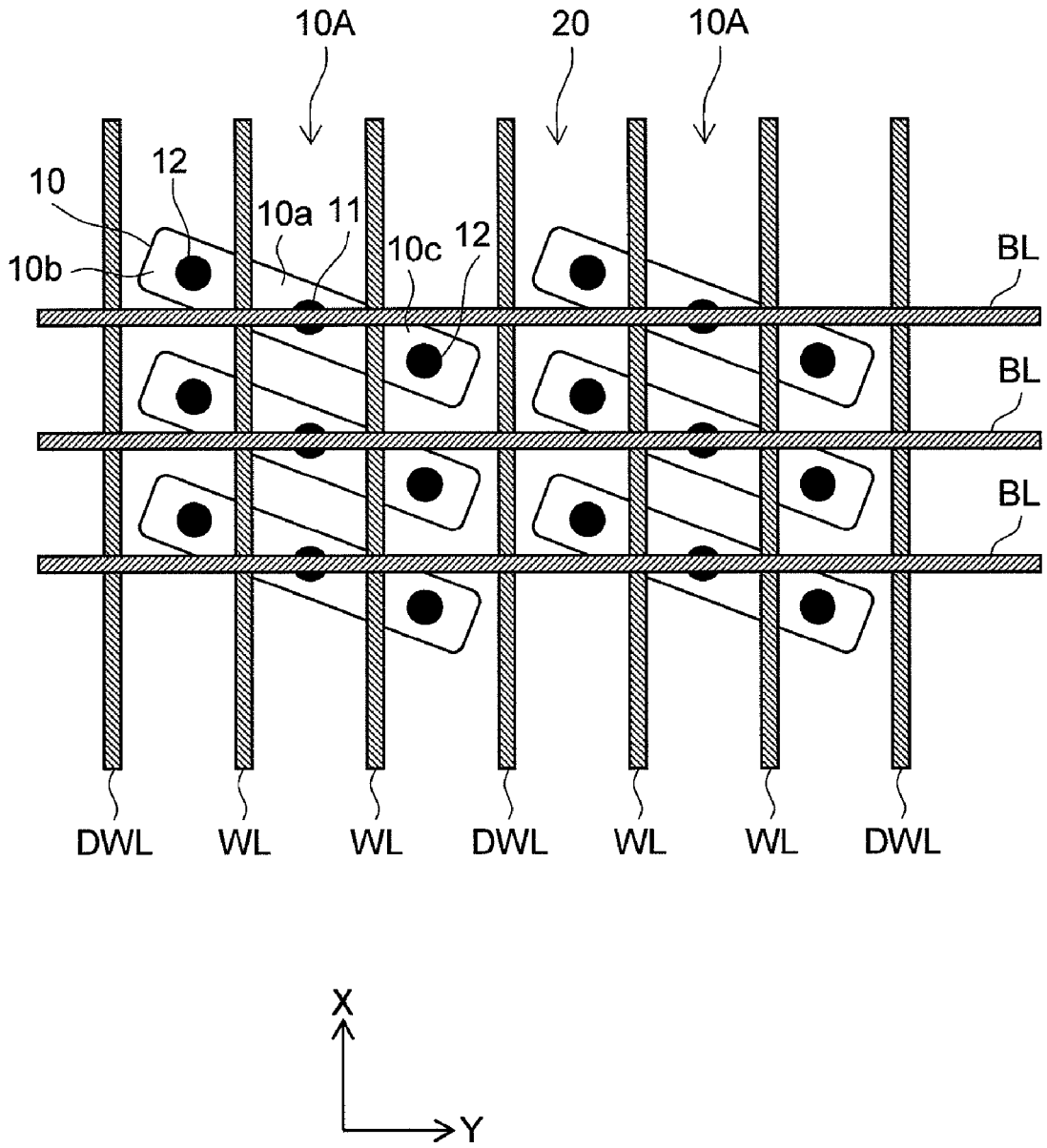
FIG. 4 is a diagram showing a layout of the active region 10 within the memory mat.

FIG. 4 shows a layout of the active region 10 within the memory mat, in which a region P in FIG. 2 is shown in an enlarged manner. The active region 10 represents a region in which a transistor that connects the memory cell MC and the bit line BL is formed. Other regions are the element isolation region 20, in which no transistor is formed, for isolating transistor devices.

As shown in FIG. 4, in the present embodiment, the longitudinal direction of the active region 10 is slightly inclined relative to the Y direction. Such active regions 10 are aligned along the X direction, and this alignment configures each active region array 10A extending in the X direction. The active region arrays 10A are arranged in a plurality of arrays in the Y direction.

According to such a configuration, the two adjacent word lines WL pass alternately over the same active region 10 and the same element isolation region 20 all the time. In such a layout, the word lines WL do not experience a constant wiring density. To make it constant, the dummy word lines DWL are located at intervals of every two word lines WL, and thereby, the wiring density including the word line WL and the dummy word line DWL is made constant. The wiring density is made constant to secure a good process condition. Thereby, the dummy word lines DWL are wired along the element isolation region 20 present between the adjacent active region arrays 10A. Care should be taken in the pattern of the dummy word lines DWL so that all the dummy word lines DWL are located in the element isolation region 20 and not located to stride over the active region 10. This is the characteristic of the layout in which the area occupied by the memory cell MC reaches $6F^2$.

The active region 10 includes three diffusion regions 10a to 10c, and each word line WL passes over among the three diffusion regions 10a to 10c. As a result, by the two adjacent diffusion regions and the word line WL, the cell transistor of the memory cell MC is configured. The diffusion region 10a positioned at the center is connected via a bit contact 11 to the corresponding bit line BL, and the diffusion regions 10b and 10c positioned at both ends are connected via the cell contacts 12 to the corresponding cell capacitors. This results in the configuration in which at each intersection between the two adjacent bit lines BL and the two adjacent word lines WL, the memory cell MC is located, realizing the layout in which the area occupied by the memory cell MC is $6F^2$.

Figure 5:
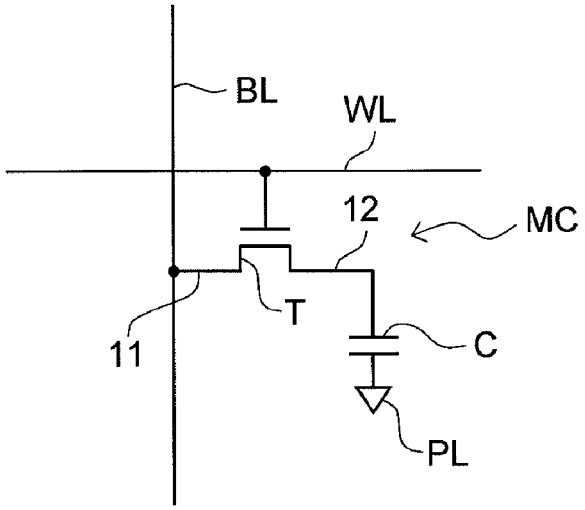
FIG. 5 is a circuit diagram of the memory cell MC.

FIG. 5 is a circuit diagram of the memory cell MC.

As shown in FIG. 5, each memory cell MC has a circuit configuration in which between the bit line BL and a plate wiring PL, a cell transistor T and a cell capacitor C are connected in series. A gate electrode of the cell transistor T is connected to the corresponding word line WL (in practice, the word line WL itself configures the gate electrode). Accordingly, when the word line WL is activated, the cell capacitor C is electrically connected to the corresponding bit line BL. One side diffusion region of the cell transistor T and the bit line BL are connected via the bit contact 11 shown in FIG. 4. The other-side diffusion region of the cell transistor T and the cell capacitor C are connected via the cell contact 12 shown in FIG. 4.

Referring back to FIG. 2, the bit lines BL in the memory mats MAT1 to MAT7 are alternately connected to the sense amplifier array SAA located on one side in the Y direction and the sense amplifier array SAA located on the other side in the Y direction. The sense amplifier array SAA is constituted by a plurality of sense amplifiers SA. Input/output nodes on one side are connected to the bit lines BL of the adjacent memory mat on one side and input/output nodes on the other side are connected to the bit lines BL of the adjacent memory mat on the other side. That is, an open bit line type is adopted.

On the other hand, in the memory mats MAT0 and MAT8 positioned at the ends, as shown in FIG. 3, the bit lines BL and dummy bit lines DBL are alternately located. The bit lines BL are connected to the sense amplifier array SAA located on one side in the Y direction, and the dummy bit lines DBL are connected to a potential supply circuit VPC located on the other side in the Y direction. The potential supply circuit VPC supplies a precharge potential (VBLP) of the bit line BL to the dummy bit line DBL.

Figure 6:
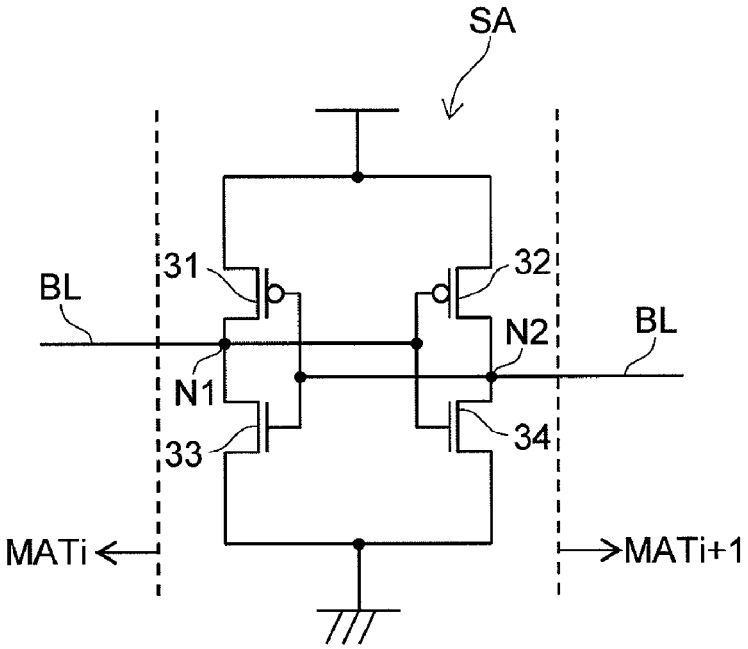
FIG. 6 is a circuit diagram of each sense amplifier SA.

FIG. 6 is a circuit diagram of each sense amplifier SA.

As shown in FIG. 6, the sense amplifier SA is constituted by flip-flop connected transistors 31 to 34 (the P-channel MOS transistors 31 and 32 and the N-channel MOS transistors 33 and 34). Connection points of the transistors 31 and 33 configure an input/output node N1 on one side, and connection points of the transistors 32 and 34 configure an input/output node N2 on the other side. The input/output node N1 is connected to the bit lines BL of adjacent memory mats MATi (i=0 to 7) on one side, and the input/output node N2 is connected to the bit line BL of adjacent memory mats MATi+1 on the other side. A high-potential-side power supply of the sense amplifier SA and a low-potential-side power supply thereof are controlled at a predetermined timing by a control circuit not shown. The illustration of a power supply line in FIG. 6 is a state of the activated sense amplifier SA.

The layout of the memory cell array unit of the semiconductor memory device is as described above. The selection of the memory mat and activation of the dummy word line DWL along therewith are described next.

Figure 7:
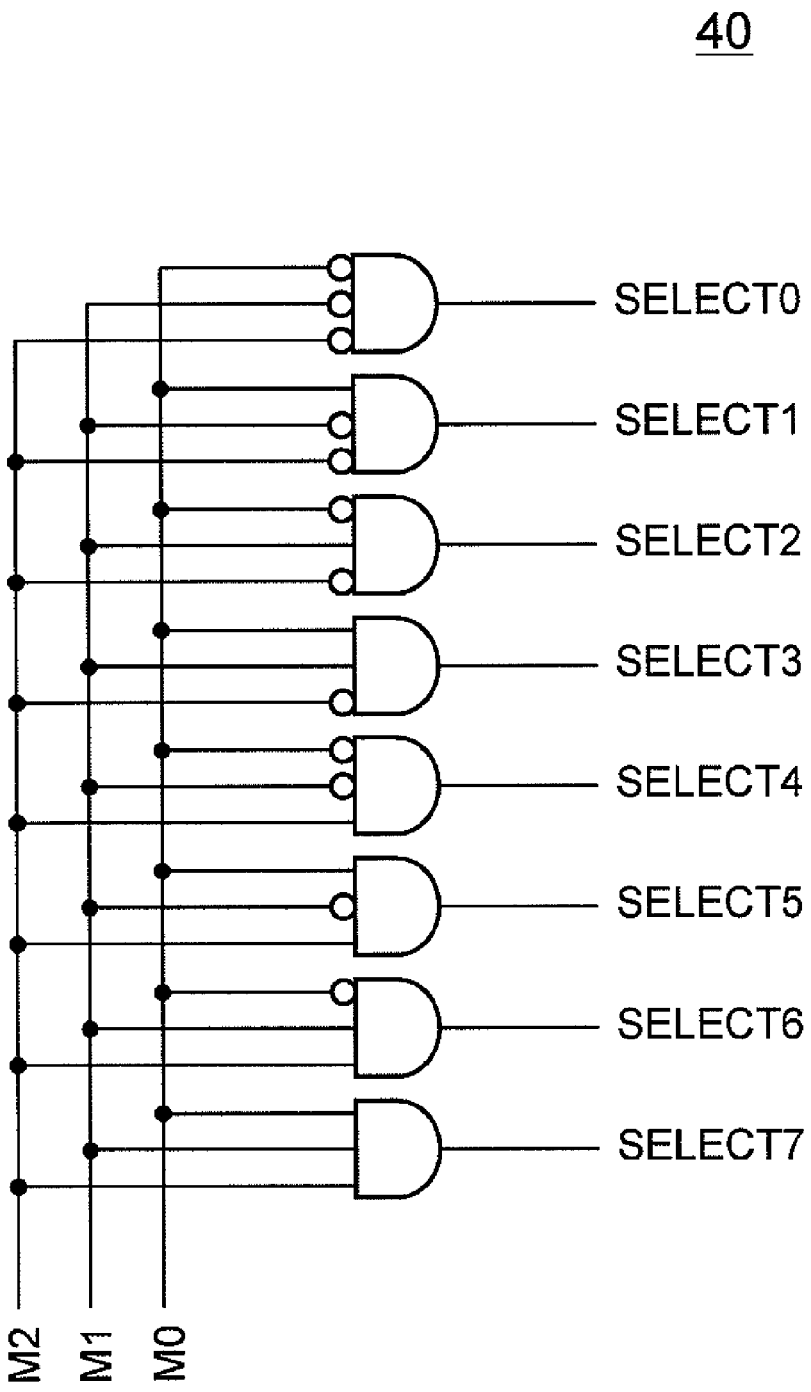
FIG. 7 is a circuit diagram of a decoder circuit 40.

FIG. 7 is a circuit diagram of a decoder circuit 40 that produces the selection signals SELECT0 to SELECT7.

As shown in FIG. 7, the decoder circuit 40 is constituted by eight AND gates in which a combination of inversion/non-inversion of the inputted mat selection signals M0 to M2 differs. Thereby, the decoder circuit 40 decodes the mat selection signals M0 to M2 that are in a binary format and activates any one of the selection signals SELECT0 to SELECT7. Relations among values of the mat selection signals M0 to M2 and the activated selection signals SELECT0 to SELECT7 is as shown in FIG. 9.

As shown in FIG. 1, among the selection signals SELECT0 to SELECT7, the selection signal SELECT0 is commonly supplied to the memory mats MAT0 and MAT8 positioned at both ends. Thus, when the values of the mat selection signals M0 to M2 are "000", the memory mats MAT0 and MAT8 are simultaneously selected. On the contrary, when the values of the mat selection signals M0 to M2 are "001" to "111", only any one of the memory mats MAT1 to MAT7 is selected according to the value. In the selected memory mat, the associated sense amplifier array SAA is controlled.

In the selected memory mat, any one of the word line drivers WLD included in the word line driver array WLDA is selected based on a row address, and the corresponding word line WL is activated. Thereby, all the memory cells MC linked to the word line WL are connected to the corresponding bit lines BL, respectively, and according to a charge held in the cell capacitor C, the potential of the bit line BL is changed. At this time, coupling noise caused due to the activation of the word line WL is superposed onto the bit line BL.

Figure 8:
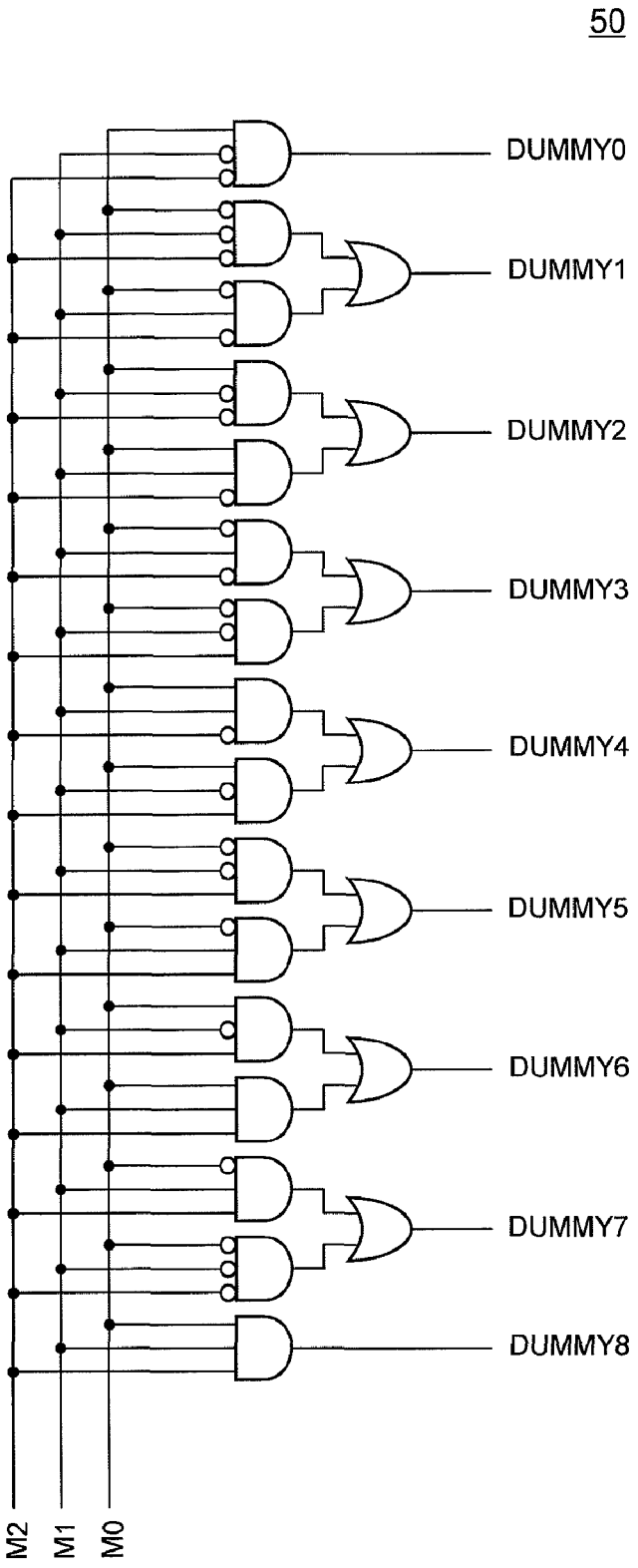
FIG. 8 is a circuit diagram of the decoder circuit 50.

FIG. 8 is a circuit diagram of the decoder circuit 50 that produces the dummy selection signals DUMMY0 to DUMMY8.

As shown in FIG. 8, the decoder circuit 50 is constituted by two sets (16 in total) of eight AND gates in which a combination of inversion/non-inversion of the inputted mat selection signals M0 to M2 differs, and seven OR gates that receive outputs of the two AND gates. By the circuit configuration shown in FIG. 8, the decoder circuit 50 decodes the mat selection signals M0 to M2 that are in a binary format and activates any two of the dummy selection signals DUMMY0 to DUMMY8. Likewise, relations among values of the mat selection signals M0 to M2 and the activated dummy selection signals DUMMY0 to DUMMY8 is shown in FIG. 9.

As shown in FIG. 9, when the memory mat is selected by the selection signals SELECT0 to SELECT7, the two dummy selection signals corresponding to the memory mat adjacent the selected memory mat are activated. The memory mats MAT0 and MAT 8 positioned at the both ends are simultaneously selected by the selection signal SELECT0, and thus, in this case, the dummy selection signals DUMMY1 and DUMMY7 are activated.

When any two of the dummy selection signals DUMMY0 to DUMMY8 are activated, the dummy word line driver DWLD is selected in the corresponding memory mat, and the dummy word line DWL is activated. Thereby, coupling noise caused due to the activation of the dummy word line DWL is superposed on the all the bit lines BL intersecting with the dummy word line DWL. As described above, because neither the memory cell MC nor the dummy cell DC is connected to the dummy word line DWL, the influence exerted by the dummy word line DWL to the bit line BL is substantially only the coupling noise.

As a result, the potentials appearing in the input/output nodes N1 and N2 of the sense amplifier SA are both potentials on which the coupling noise is superposed, and thus the noise is canceled. Moreover, because neither the memory cell MC nor the dummy cell DC is connected to the dummy word line DWL, the coupling noise is accurately canceled.

Figure 10A:
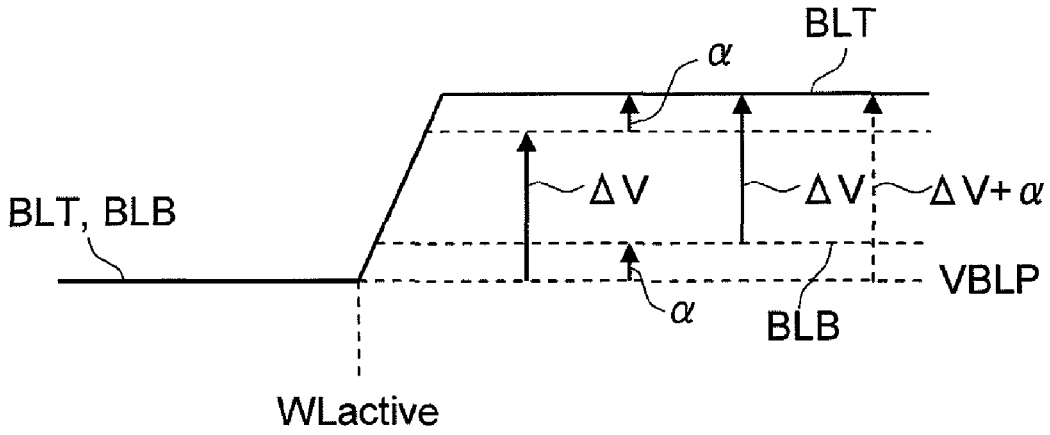
FIGS. 10A and 10B are timing charts showing a potential change of the bit line BL, where
Figure 10B:
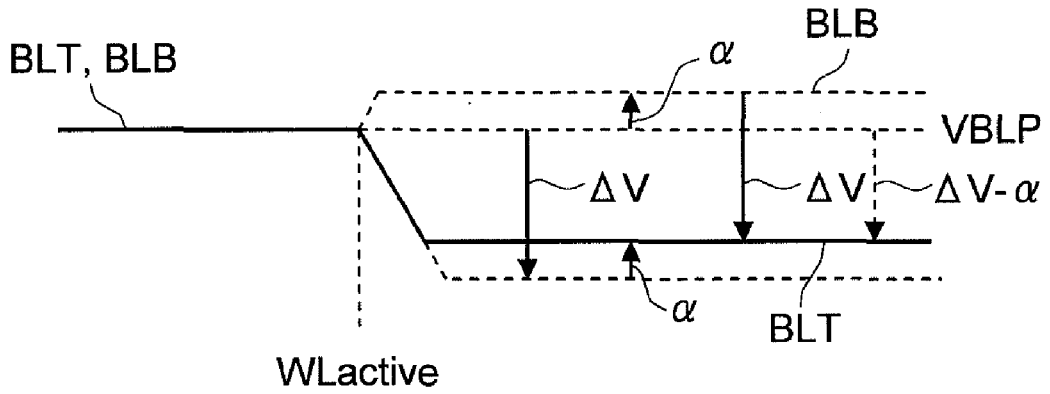

FIGS. 10A and 10B are timing charts showing a potential change of the bit line BL, where FIG. 10A shows a case that a high level is held at the cell capacitor C of the memory cell MC, which is a reading target, and FIG. 10B shows a case that a low level is held at the same. In FIGS. 10A and 10B, BLT denotes a bit line connected to a memory cell MC, which is a reading target, and BLB denotes a bit line that is a reference side. The bit line BLT is connected to one of the input/output nodes N1 and N2 of the sense amplifier SA, and the bit line BLB is connected to the other thereof.

As shown in FIG. 10A, when the cell capacitor C holding the high level is connected to the bit line BLT, the potential of the bit line BLT is raised by $\Delta V+\alpha$ from the precharge level VBLP. $\Delta V$ denotes an upward component by a charge flowing from the cell capacitor C and a denotes coupling noise occurring along with the activation of the word line WL. On the other hand, the bit line within the adjacent memory mat, that is, the bit line BLB that is a reference side, rises by $\alpha$ along with the activation of the dummy word line DWL. As a result, a potential difference occurring between a pair of bit lines BLT and BLB is $\Delta V$ and coincides with the upward component caused as a result of the charge being flowing from the cell capacitor C. If the activation of the dummy word line DWL is not performed, the potential of the bit line BLB that is a reference side remains the precharge level VBLP. Thus, the potential difference is $\Delta V+\alpha$.

On the other hand, when the cell capacitor C holding the low level is connected to the bit line BLT, the potential of the bit line BLT is lowered by $\Delta V-\alpha$ from the precharge level VBLP, as shown in FIG. 10B. $\Delta V$ denotes a downward component caused as a result of the charge being flowing into the cell capacitor C. On the other hand, the bit line BLB that is a reference side rises by a along with the activation of the dummy word line DWL. As a result, a potential difference occurring between a pair of bit lines BLT and BLB is $\Delta V$, and coincides with the downward component caused as a result of the charge being flowing into the cell capacitor C. If the activation of the dummy word line DWL is not performed, the potential of the bit line BLB that is a reference side remains the precharge level VBLP. Thus, the potential difference is $\Delta V-\alpha$, and this means that the potential difference is shrunk. On the contrary, in the present embodiment, the dummy word line DWL within the adjacent memory mat is activated, and thus the reduction of the potential difference occurring between the pair of bit lines BLT and BLB is corrected, and as a result, the potential difference of $\Delta V$ can be secured.

As described above, according to the present embodiment, irrespective of the content of the data held in the memory cell MC, the potential difference occurring between the pair of bit lines BLT and BLB is $\Delta V$ all the time, and thus the operation margin of the sense amplifier SA can be sufficiently secured. Moreover, as described above, neither the memory cell MC nor the dummy cell DC is connected to the dummy word line DWL, and thus the coupling noise can be accurately canceled. A circuit that supplies the dummy cell with an intermediate potential or the like becomes unnecessary. Further, the coupling noise is canceled by utilizing the dummy word line DWL that is basically unused, and thus the area occupied by the memory mat does not increase. Therefore, it is possible to cancel coupling noise occurring in an open bit line type while suppressing the problem of increasing the chip size.

Further, in the present embodiment, the memory mats MAT0 and MAT8 positioned at the both ends are simultaneously selected by the selection signal SELECT0 while the dummy selection signals DUMMY0 and DUMMY8 corresponding thereto are not simultaneously activated. More specifically, when the memory mat MAT1 is selected, the dummy selection signals DUMMY0 and DUMMY2 are activated while the dummy selection signal DUMMY8 is not activated. Similarly, when the memory mat MAT7 is selected, the dummy selection signals DUMMY6 and DUMMY8 are activated while the dummy selection signal DUMMY0 is not activated. In this way, although the memory mats MAT0 and MATS at the both ends are simultaneously selected, the dummy selection signals DUMMY0 and DUMMY8 corresponding thereto are selectively activated. Thus, the dummy word line DWL within the non-adjacent memory mat is not activated unnecessarily, and as a result, it becomes possible to prevent the generation of wasteful power consumption.

It is apparent that the present invention is not limited to the above embodiments, but may be modified and changed without departing from the scope and spirit of the invention.

For example, in the above embodiment, a case that the present invention is applied to the DRAM has been described as an example. However, the scope of the present invention is not limited thereto, and the invention can be applied to various types of semiconductor memory devices adopting the open bit line type. That is, needless to say, the semiconductor memory device claimed by the present invention can be also applied generally to devices, comprising characteristics of the appended claims of the present invention, included in a semiconductor device such as CPU, MCU, or DSP. The present invention can be also applied to a semiconductor device such as SOC (system on chip), MCP (multi-chip package), or POP (package on package), comprising the characteristics of the claims of the present invention. Circuit formats of the memory cell MC and the sense amplifier SA can be flexibly designed. In addition, the transistor is not limited to an MOS transistor, and can be applied to various types of FETs, that is, other types of FETs (field effect transistors) such as MIS (metal-insulator semiconductor) transistor or TFT (thin film transistor). A bipolar transistor can also be used. Further, a PMOS transistor (P-channel MOS transistor) is a representative example of a first conductivity type transistor, and an NMOS transistor (N-channel MOS transistor) is a representative example of a second conductivity type transistor.

What is claimed is:

1. A semiconductor memory device comprising:

a plurality of memory mats each including a plurality of word lines, a plurality of bit lines, a plurality of memory cells each located at an intersection between the word line and the bit line, *one or more dummy cells,* and at least one dummy word line not having connection to [a] *any* dummy cell *in the mat*;

a plurality of sense amplifier arrays located between adjacent memory mats, the sense amplifier arrays including a plurality of sense amplifiers including a pair of input/output nodes, one of which pair is connected to the bit lines of the adjacent memory mats on one side and the other of which pair is connected to the bit lines of the adjacent memory mats on the other side, respectively*, and wherein in each memory mat, no two adjacent bit lines of the plurality of bit lines for the memory mat are coupled to the same sense amplifier*; and an activating unit which, in response to activation of the word line in a memory mat selected from the memory mats, activates the dummy word line in the memory mat adjacent to the selected memory mat.

2. The semiconductor memory device as claimed in claim 1, wherein the dummy word lines in the memory mats adjacent to both sides of the selected memory mat are respectively activated when memory mats other than the memory mats positioned at both ends are selected from the memory mats.

3. The semiconductor memory device as claimed in claim 1, wherein among the memory mats, the memory mats positioned at both ends are simultaneously selected, and the dummy word lines in the memory mats adjacent to the memory mats positioned at the both ends are respectively activated.

4. The semiconductor memory device as claimed in claim 1, wherein the memory mats include a first memory mat positioned at one end, a second memory mat adjacent to the first memory mat, a third memory mat positioned at the other end, and a fourth memory mat adjacent to the third memory mat, the first memory mat and the third memory mat are simultaneously selected, and when the first and third memory mats are selected, the activating unit activates both of the dummy word lines belonging to the second and fourth memory mats, when the second memory mat is selected, the activating unit activates the dummy word line belonging to the first memory mat without activating the dummy word line belonging to the third memory mat, and when the fourth memory mat is selected, the activating unit activates the dummy word line belonging to the third memory mat without activating the dummy word line belonging to the first memory mat.

5. The semiconductor memory device as claimed in claim 1, wherein the dummy word lines are located at an interval of every two of the word lines.

6. The semiconductor memory device as claimed in claim 5, wherein within the memory mats, a plurality of active region arrays aligned along a wiring direction of the word lines are arranged, and the dummy word lines are wired along an element isolation region located between adjacent active region arrays.

7. The semiconductor memory device as claimed in claim 1, wherein the memory mats further include an unused word line connected to [a] *at least one of the one or more* dummy [cell] *cells*, and the unused word line is fixed in an inactive state.

8. A semiconductor memory device comprising:

a plurality of memory mats each including a plurality of word lines, a plurality of dummy word lines located at an interval of every two of the word lines, a plurality of bit lines intersecting each of the word line and each of the dummy word line, and a plurality of memory cells each located at an intersection of each of the word line and each of the bit line;

a plurality of sense amplifier arrays located between adjacent memory mats, the sense amplifier arrays including a plurality of sense amplifiers including a pair of input/output nodes, one of which pair is connected to the bit lines of the adjacent memory mats on one side and the other of which pair is connected to the bit lines of the adjacent memory mats on the other side, respectively*, and wherein in each memory mat, no two adjacent bit lines of the plurality of bit lines for the memory mat are coupled to the same sense amplifier*; and an activating unit which, in response to activation of the word line in a memory mat selected from the memory mats, activates the dummy word line in the memory mat adjacent to the selected memory mat, wherein within the memory mats, a plurality of active region arrays aligned along a wiring direction of the word lines are arranged, and the dummy word lines are wired along an element isolation region located between the adjacent active region arrays.

9. The semiconductor memory device as claimed in claim 8, wherein the memory cell is located at each intersection of two of the adjacent bit lines and two of the adjacent word lines.

10. The semiconductor memory device as claimed in claim 8, wherein the bit lines are alternately connected to the sense amplifier arrays located on one adjacent side and the sense amplifier arrays located on the other adjacent side.

*11. A semiconductor device comprising:*

*a plurality of memory arrays each including a plurality of word lines and a plurality of bit lines intersecting each of the word lines, wherein every third word line is a dummy word line and the word lines other than the dummy word lines are active word lines, wherein for each memory array, no two adjacent bit lines of the plurality of bit lines are coupled to the same sense amplifier;*

*a plurality of memory cells each located at an intersection of a respective active word line and a respective bit line;*

*a plurality of word line drivers each connected to a respective active word line; and*

*one or more dummy word line drivers each connected to a respective dummy word line, wherein a plurality of dummy word lines not connected to the one or more dummy word line drivers are connected to a fixed potential,*

*wherein the device is configured such that upon the activation of a word line driver of a memory array of the plurality of memory arrays, a dummy word line driver of the one or more dummy word line drivers is activated in an adjacent memory array.*

*12. The semiconductor device as claimed in claim 11 wherein the fixed potential is a ground potential.*

*13. The semiconductor device as claimed in claim 11 wherein the fixed potential is a negative potential.*

*14. The semiconductor device as claimed in claim 11 further comprising an unused word line at each of two ends of each of the plurality of memory arrays and a plurality of memory cells each located at an intersection of a respective unused word line and a respective bit line.*

*15. The semiconductor device as claimed in claim 14 further comprising a plurality of word line drivers each connected to a respective unused word line.*

*16. The semiconductor device as claimed in claim 11 further comprising two unused word lines at each of two ends of each of the plurality of memory arrays and a plurality of memory cells each located at an intersection of a respective unused word line and a respective bit line.*

*17. The semiconductor device as claimed in claim 16 further comprising a plurality of word line drivers each connected to a respective unused word line.*

*18. The semiconductor device as claimed in claim 11 further comprising a plurality of sense amplifiers located between adjacent memory arrays.*

*19. The semiconductor device as claimed in claim 18 wherein each of the plurality of sense amplifiers is connected to a respective bit line of one of the adjacent memory arrays and a respective bit line of another of the adjacent memory arrays.*

*20. The semiconductor device as claimed in claim 18 further comprising a potential supply circuit located at one side of memory arrays not having an adjacent memory array on the one side and connected to bit lines not connected to a sense amplifier.*

*21. The semiconductor device as claimed in claim 20 wherein the potential supply circuit supplies a precharge potential to the bit lines not connected to a sense amplifier.*

*22. The semiconductor device as claimed in claim 11 wherein the plurality of memory arrays are open bit line memory arrays.*

* * * * *